(12) United States Patent
Morita

(10) Patent No.: US 9,860,973 B2
(45) Date of Patent: Jan. 2, 2018

(54) CONTACTOR WITH CABLE AND WIRING BOARD

(71) Applicant: FUJITSU LIMITED, Kawasaki-shi, Kanagawa (JP)

(72) Inventor: Yoshihiro Morita, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/220,575

(22) Filed: Jul. 27, 2016

(65) Prior Publication Data

US 2017/0047672 A1 Feb. 16, 2017

(30) Foreign Application Priority Data

Aug. 14, 2015 (JP) .................................. 2015-160119

(51) Int. Cl.
*H05K 1/02* (2006.01)

(52) U.S. Cl.
CPC . *H05K 1/0243* (2013.01); *H05K 2201/10325* (2013.01); *H05K 2201/10356* (2013.01); *H05K 2201/10719* (2013.01)

(58) Field of Classification Search
CPC .... H01R 12/7082; H01R 12/70; H01R 13/24; H01R 9/031; H01R 9/03; H05K 1/0243; H05K 7/20; H05K 2201/10719; H05K 2201/10356; H05K 2201/10325
USPC .......................................................... 439/82
See application file for complete search history.

(56) References Cited

U.S. PATENT DOCUMENTS 3,910,665 A * 10/1975 Stull ...................... H01R 24/50
439/581
5,046,966 A 9/1991 Snyder et al.

FOREIGN PATENT DOCUMENTS

| JP | 04-233179 A | 8/1992 |
| JP | 10-312863 A | 11/1998 |
| WO | WO 2009/031394 A1 | 3/2009 |

* cited by examiner

*Primary Examiner* — Harshad C Patel
(74) *Attorney, Agent, or Firm* — Squire Patton Boggs (US) LLP

(57) ABSTRACT

A contactor coupled to an electrode of a semiconductor package mounted on a mounting surface of a wiring board, the contactor includes: a cable including a core line; a connector attached to a front end of the cable, and to be inserted into a through hole that penetrates the wiring board in a thickness direction thereof; and a signal land formed on a front end surface of the connector, and electrically coupled with the core line.

6 Claims, 17 Drawing Sheets

CONTACTOR WITH CABLE AND WIRING BOARD

CROSS-REFERENCE TO RELATED APPLICATION

This application is based upon and claims the benefit of priority of the prior Japanese Patent Application No. 2015-160119, filed on Aug. 14, 2015, the entire contents of which are incorporated herein by reference.

FIELD

The embodiments discussed herein are related to a contactor and a wiring board.

BACKGROUND

Conventionally, in electronic devices such as, for example, a server, a router, or a storage product, an electrical signal is transmitted using a backplane or a cable, between respective wiring boards between or in respective electronic devices.

Recently, there is a case in which a differential signal transmission is performed using a differential signal transmission cable in order to transmit a high-speed electrical signal between respective wiring boards. The differential signal transmission cable has a pair of core lines (signal line conductors). A plus side signal and a minus side signal obtained by reversing a phase at 180° are transmitted in the core lines, respectively. Further, a potential difference between the two signals becomes a signal level, and is recognized in the reception side in such a way that, when the potential difference is plus, the signal level is recognized as "High," and when the potential difference is minus, the signal level is recognized as "Low."

However, conventionally, when an electrical signal is transmitted to a semiconductor package mounted on the wiring board via a cable, a connector placed on a front end side of the cable is connected to a connector on the wiring board, and the electrical signal is transmitted through a wiring pattern of the wiring board. Consequently, the mismatching of impedance may be caused, for example, at a contact point of the connector to increase a transmission loss. Further, since the electrical signal is transmitted through the wiring pattern of the wiring board, the transmission loss may be increased.

The followings are reference documents.
[Document 1] International Publication Pamphlet No. WO 2009/031394,
[Document 2] Japanese Laid-Open Patent Publication No. 10-312863, and
[Document 3] Japanese Laid-Open Patent Publication No. 04-233179.

SUMMARY

According to an aspect of the invention, a contactor coupled to an electrode of a semiconductor package mounted on a mounting surface of a wiring board, the contactor includes: a cable including a core line; a connector attached to a front end of the cable, and to be inserted into a through hole that penetrates the wiring board in a thickness direction thereof; and a signal land formed on a front end surface of the connector, and electrically coupled with the core line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, exemplary embodiments according to the present invention will be described in detail with reference to the accompanying drawings.

Exemplary Embodiment 1

Figure 1:
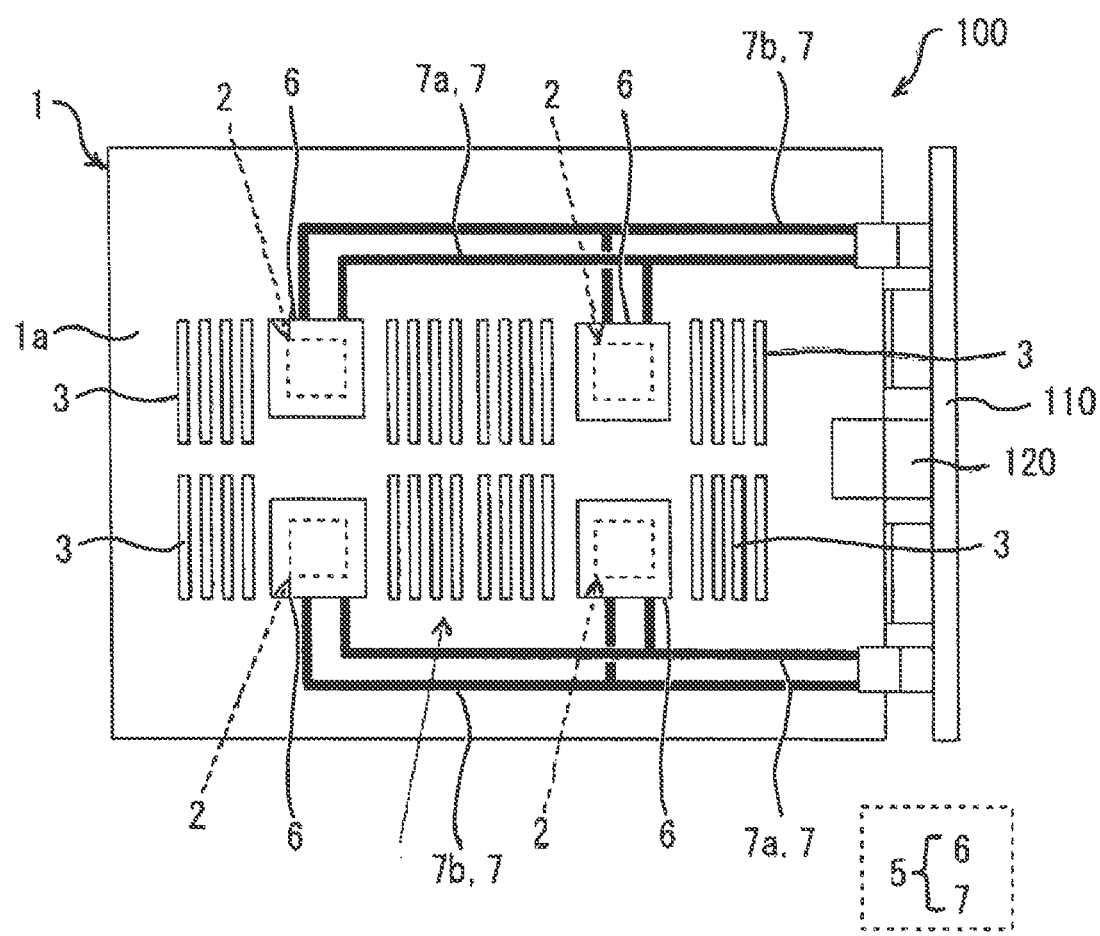
FIG. 1 is a plan view illustrating a board unit having a wiring board according to exemplary embodiment 1.

FIG. 1 is a plan view illustrating a board unit 100 having a wiring board 1 according to an exemplary embodiment 1.

Figure 2:
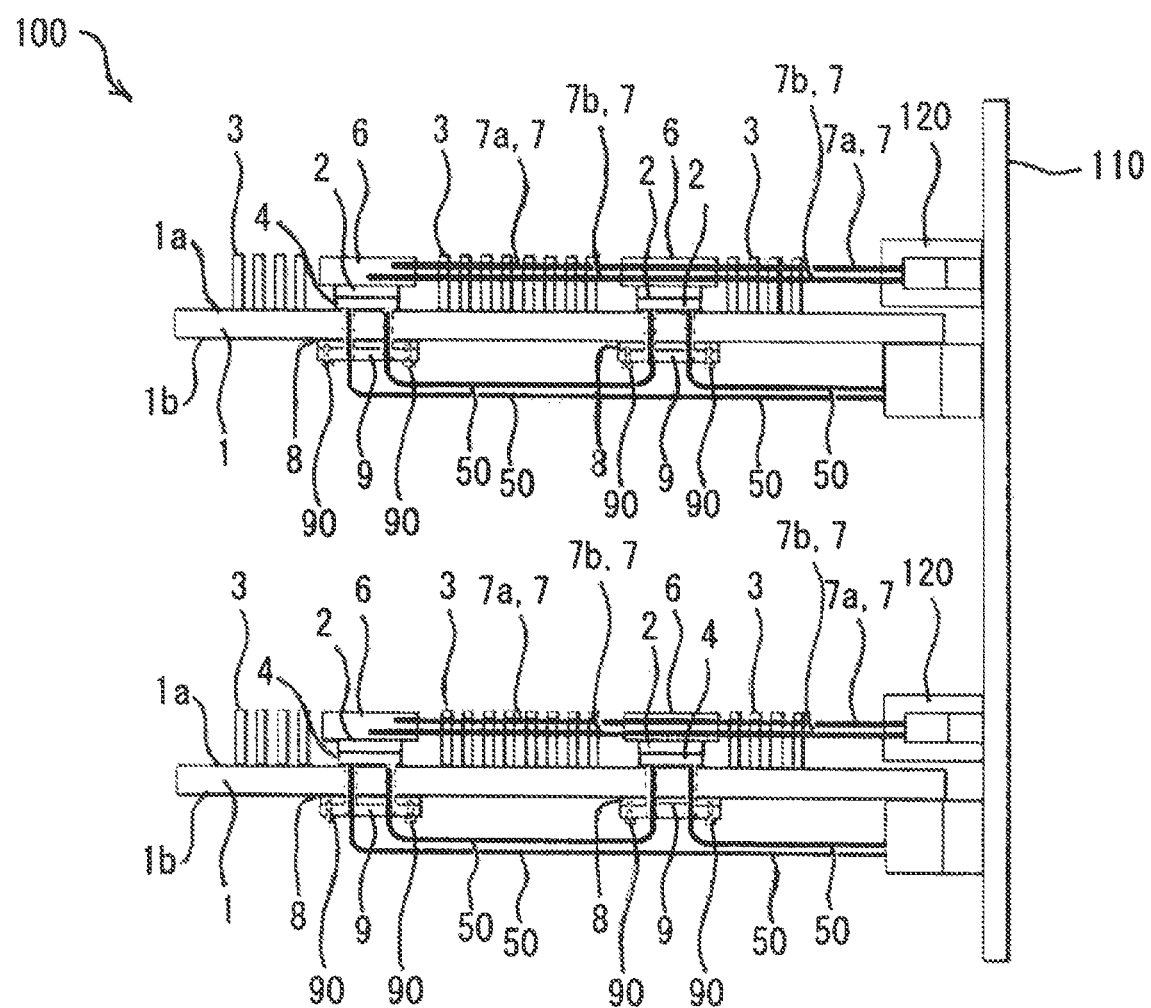
FIG. 2 is a side view illustrating the board unit according to exemplary embodiment 1.

FIG. 2 is a side view illustrating the board unit 100 according to exemplary embodiment 1.

The wiring board 1 has, on the top side thereof, a mounting surface 1a on which a semiconductor package 2 is mounted. Further, the wiring board 1 has, on the bottom side thereof, a non-mounting surface 1b on which a semiconductor package 2 is not mounted. In an example illustrated in FIG. 1, four semiconductor packages 2 are mounted on the mounting surface 1a of the wiring board 1, but the number of mounting the semiconductor packages 2 is not limited particularly. A memory 3 is mounted on the mounting surface 1a of the wiring board 1.

Figure 3:
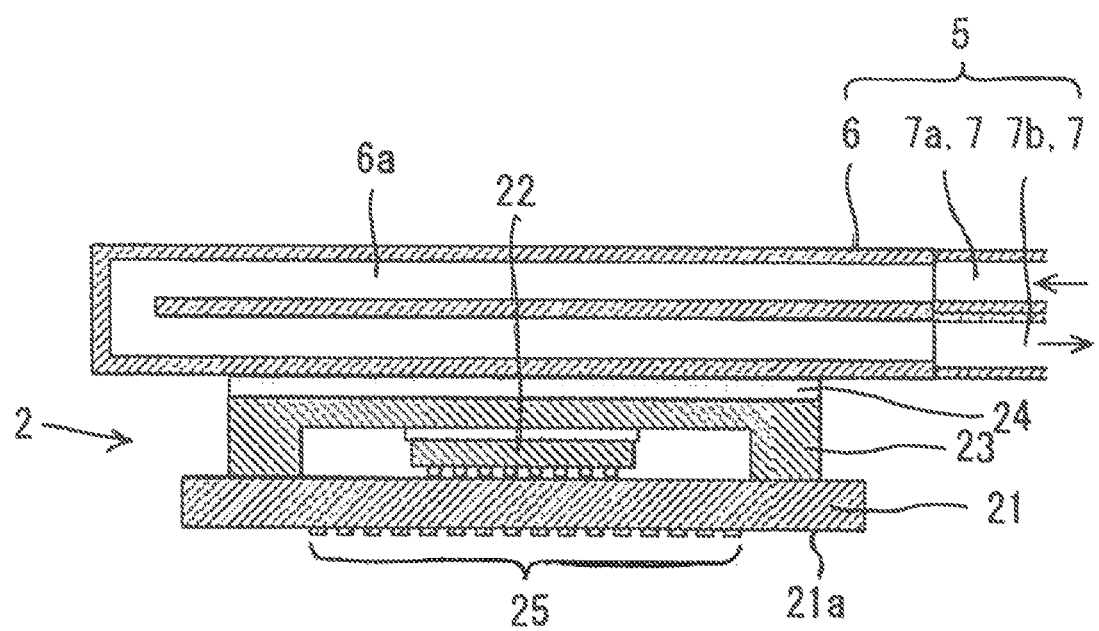
FIG. 3 is a schematic structural view illustrating a semiconductor package according to exemplary embodiment 1.

FIG. 3 is a schematic structural view illustrating a semiconductor package 2 according to exemplary embodiment 1. The semiconductor package 2 includes, for example, a package board 21, a semiconductor chip 22, a heat spreader 23, and a thermal sheet 24. A connecting structure between the semiconductor package 2 and the wiring board 1 employs a land grid array (LGA) mounting type, and an LGA socket 4 is interposed between the semiconductor package 2 and the wiring board 1. The package board 21 is formed by, for example, a glass epoxy multi-layered board. A plurality of electrodes 25 (hereinafter, referred to as "lands") is placed on the bottom surface 21a of the package board 21.

A semiconductor chip 22 is mounted on the top surface of a package board 21 by, for example, flip-chip connection. The heat spreader 23 is a member that serves as a lid (cap) for closing the semiconductor chip 22 and serves to transfer heat from the semiconductor chip 22, which is a heating element, to a cooling section 6 of a cooling unit 5. The heat spreader 23 is attached to the top surface of the package board 21 by, for instance, a thermosetting resin. The heat spreader 23 may be made of a metal material that is excellent in heat conductivity (thermal conductivity) (e.g., copper or aluminum). The cooling section 6 of the cooling unit 5 is mounted on the top surface of the heat spreader 23 with the thermal sheet 24 being interposed therebetween, and heat is transferred from the semiconductor chip 22 to the cooling section 6 through the heat spreader 23 and the thermal sheet 24.

As illustrated in FIGS. 1 and 3, the cooling unit 5 includes the cooling section 6 and a water-cooling pipe 7 connected to the cooling section 6. The interior of the cooling section 6 is formed in a water-jacket structure, and has an internal path 6a to pass coolant therethrough. The water-cooling pipe 7 has a supply pipe 7a and a discharge pipe 7b, and forms a coolant circulation path as well as the internal path 6a of the cooling section 6. The coolant fed from the supply pipe 7a to the cooling section 6 absorbs heat of the semiconductor chip 22 transferred from the heat spreader 23 or the thermal sheet 24, and then is discharged to the discharge pipe 7b. In this way, the semiconductor chip 22 is cooled by the cooling unit 5.

As illustrated in FIG. 2, a bolster plate 8 is placed on the non-mounting surface 1b of the wiring board 1. The bolster plate 8 is secured to the wiring board 1 by a fastener (not illustrated). For example, flange parts (not illustrated) arranged on the bolster plate 8 and the cooling section 6 are fastened by a plurality of spring-loaded bolts (not illustrated) that is inserted through bolt passing holes of the wiring board 1. Thus, the semiconductor package 2 and the LGA socket 4, which are fitted to the mounting surface 1a of the wiring board 1 and the cooling section 6, are pushed and pressed against the mounting surface 1a so that the semiconductor package 2 and the LGP socket 4 are secured to the mounting surface 1a. Further, reference numeral 9 indicated in FIG. 3 denotes a cable holding plate placed on the back surface of the bolster plate 8. The cable holding plate 9 will be described later.

In addition, reference numeral 110 indicated in FIGS. 1 and 2 denotes a backplane, and reference numeral 120 denotes a power connector. A plurality of wiring boards 1 is mounted on the backplane 110 via connectors (not illustrated). In an example illustrated in FIG. 2, two wiring boards 1 are attached to the backplane 110, but the number of the wiring boards is not limited particularly. The power connector 120 supplies power from a power supply unit (not illustrated) to the wiring board 1. Further, reference numeral 50 indicated in FIG. 2 denotes a "contactor". The details of the contactor 50 will be described below.

Figure 4:
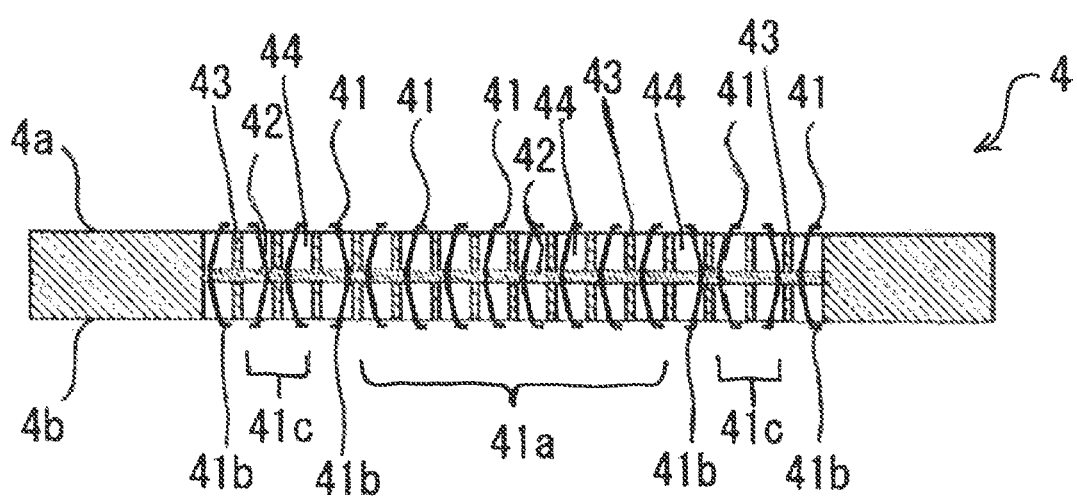
FIG. 4 is a view illustrating a sectional structure of an LGA socket according to exemplary embodiment 1.

FIG. 4 is a view illustrating a sectional structure of the LGA socket 4 according to exemplary embodiment 1. The LGA socket 4 has a plurality of contact pins 41 and a support base 42 that supports each of the contact pins 41. As an example of a material for the support base 42, a ceramic material such as, for example, alumina may be exemplified. The contact pins 41 are, for example, C-shaped metal springs and pass through the support base 42. In a state before the LGA socket 4 is interposed between the wiring board 1 and the semiconductor package 2, one end of each of the contact pins 41 protrudes upwards from the top surface 4a of the LGA socket 4, and the other end protrudes downwards from the bottom surface 4b of the LGA socket 4.

Further, the LGA socket 4 includes partition walls 43 that partition the internal space, and storage chambers 44 are formed by the partition walls 43 to store the contact pins 41, respectively. However, the storage chambers 44 for the contact pin 41 may not be individually formed by the partition walls 43. In FIG. 4, reference numeral 41a denotes a "power contact pin," reference numeral 41b denotes a "ground (GND) contact pin," and reference numeral 41c denotes a "signal contact pin." They will be collectively referred to as contact pins 41.

Figure 5:
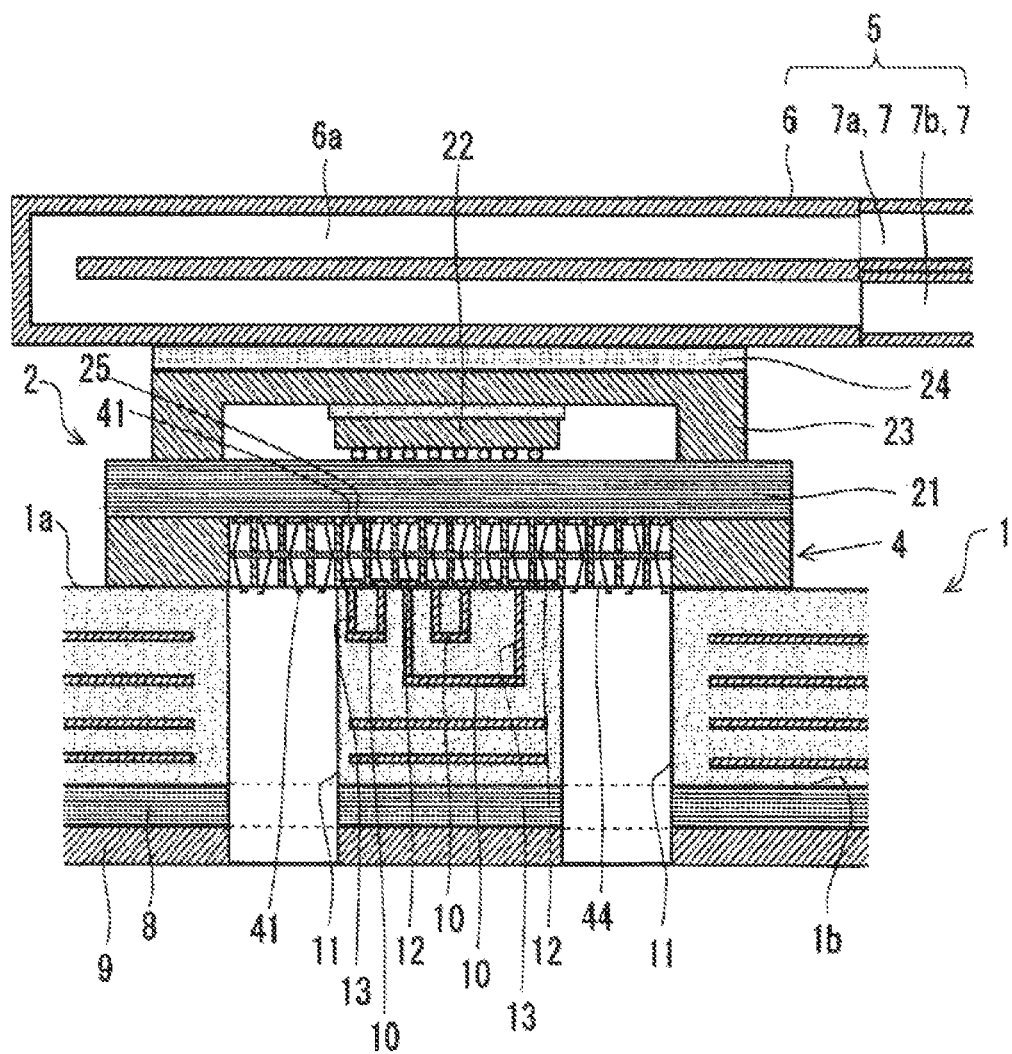
FIG. 5 is a schematic view illustrating a sectional structure of the wiring board according to exemplary embodiment 1.
Figure 6:
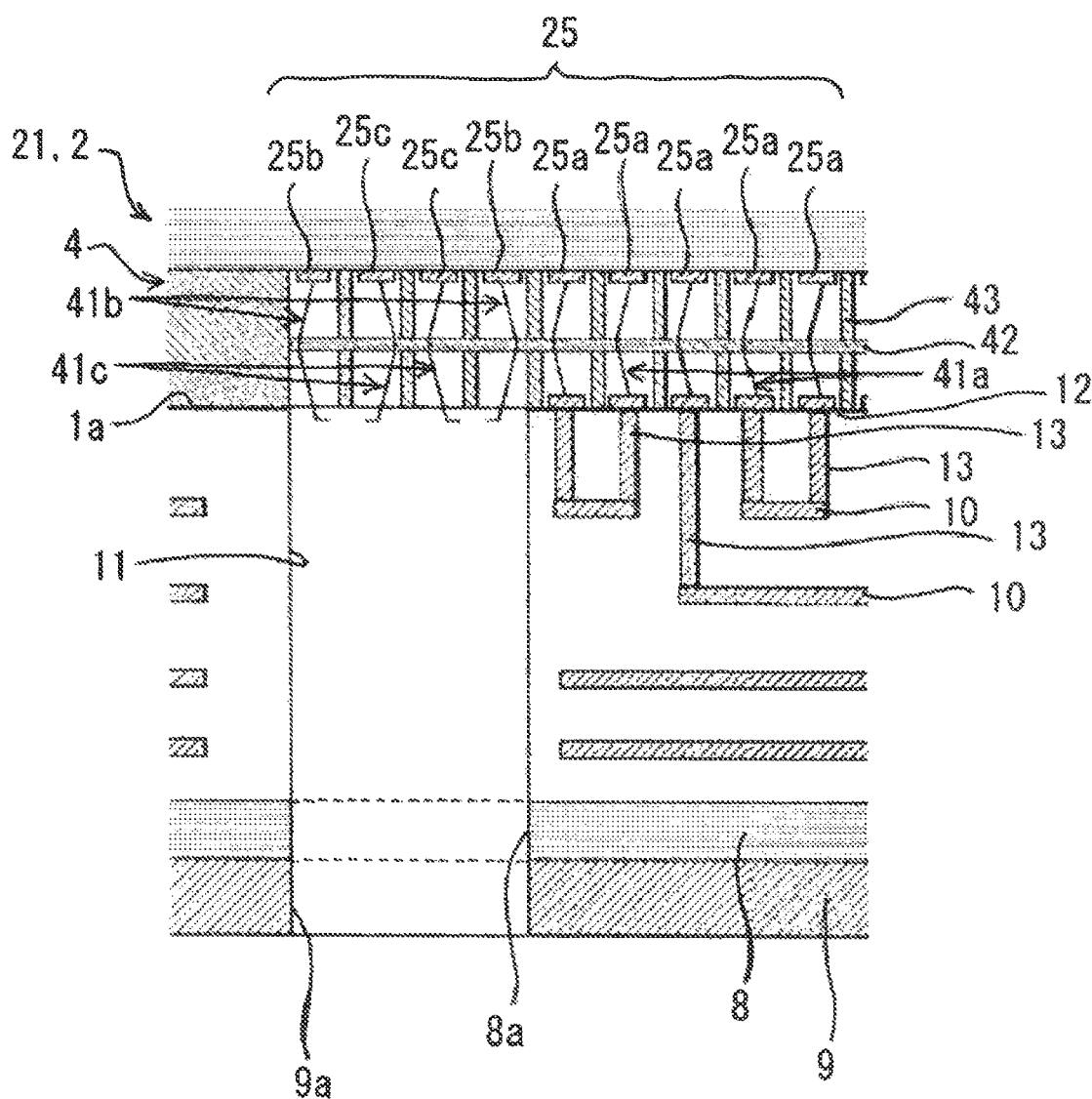
FIG. 6 is a view illustrating a portion of FIG. 5 in an enlarged scale.

FIG. 5 is a schematic view illustrating a sectional structure of the wiring board 1 according to exemplary embodiment 1. FIG. 6 is a view illustrating a portion of FIG. 5 in an enlarged scale. The wiring board 1 is, for example, a multi-layered board and includes a wiring pattern 10 formed therein. The wiring pattern 10 is, for example, a power wiring layer. Two through holes 11 are provided in the wiring board 1 to penetrate the wiring board 1 in the thickness direction thereof. Further, a plurality of lands 12 is placed on the mounting surface 1a of the wiring board 1 (hereinafter, the plurality of lands 12 will be referred to as "board side lands"). The wiring pattern 10 is connected to the board side lands 12 through vias 13. In the package side lands 25 placed on the bottom surface 21a of the package board 21, reference numeral 25a denotes a "package side power land," reference numeral 25b denotes a "package side ground (GND) land," and reference numeral 25c denotes a "package side signal land."

The LGA socket 4 is disposed between the mounting surface 1a of the wiring board 1 and the semiconductor package 2. During the assembly of the wiring board 1, when a spring-loaded bolt (not illustrated) is fastened so as to fasten the bolster plate 8 and the cooling section 6 to each other, the LGA socket 4 sandwiched between the mounting surface 1a of the wiring board 1 and the semiconductor package 2 is compressed. At this time, the power contact pin 41a of the LGA socket 4 is aligned with the package side power land 25a and the board side land 12. Thus, the package side power land and the board side land 12 are pushed against the end of the power contact pin 41a of the LGA socket 4, so that they are pressure-welded to each other. Consequently, the package side power land 25a and the board side land 12 are electrically connected to each other through the power contact pin 41a of the LGA socket 4 (see FIG. 6).

As illustrated in FIG. 6, in the state where the LGA socket 4 is disposed between the wiring board 1 and the semiconductor package 2, the package side GND land 25b is pushed against the GND contact pin 41b of the LGA socket 4, so that they are elastically pressure-welded to each other. Further, the package side signal land 25c is pushed against the signal contact pin 41c of the LGA socket 4, so that they are elastically pressure-welded to each other. Thus, the GND contact pin 41b and the package side GND land 25b, and the signal contact pin 41c and the package side signal land 25c are electrically connected to each other.

Figure 7:
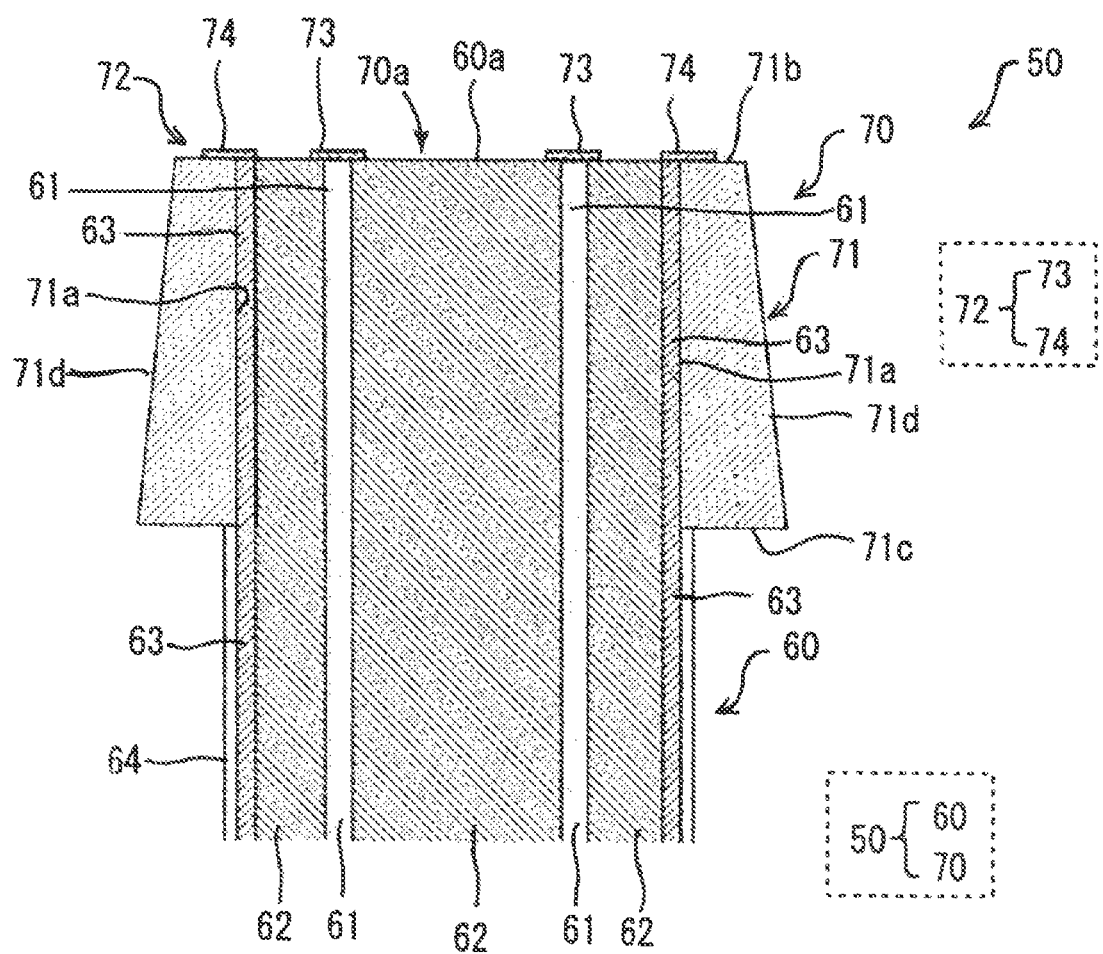
FIG. 7 is a view illustrating a longitudinal sectional structure of a contactor according to exemplary embodiment 1.

Next, a high-speed cable transmission between a contactor 50 and a semiconductor package 2 will be described. FIG. 7 is a view illustrating a longitudinal sectional structure of the contactor 50 according to exemplary embodiment 1. The contactor 50 includes a cable part 60 and a connector 70 provided on the front end side of the cable part 60. In the present exemplary embodiment, the cable part 60 of the contactor 50 is a differential signal transmission cable having two differential signal core lines 61.

Figure 8:
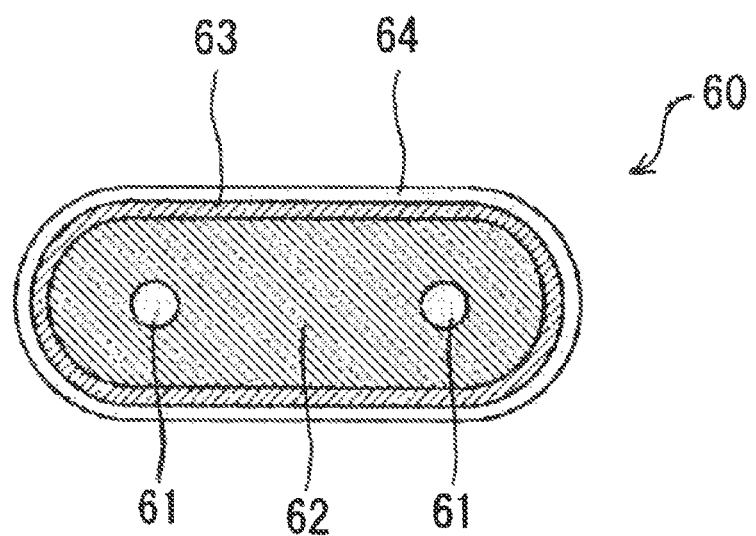
FIG. 8 is a view illustrating a cross-sectional structure of a cable part of the contactor according to exemplary embodiment 1.

FIG. 8 is a view illustrating a transverse sectional structure of the cable part 60 of the contactor 50 according to exemplary embodiment 1. The cable part 60 is a so-called differential signal transmission cable. The cable part 60 includes a pair of differential signal core lines 61 for differential signals, which are conductors for transmitting high-speed differential signals. Hereinafter, the "core lines for differential signals" will be referred to as "differential signal transmission core lines" for the convenience of description. A plus side signal as the differential signal is transmitted in any one of the differential signal core lines 61. Further, a minus side signal as a differential signal is transmitted in the remaining one of the differential signal core lines 61. A potential difference between the two signals becomes a signal level, and is recognized in the reception side in such a way that, when the potential difference is plus, the signal level is recognized as "High", and when the potential difference is minus, the signal level is recognized as "Low." Each differential signal core line 61 may be formed, for example, by a soft copper wire whose surface is plated with tin.

Further, the perimeter of the pair of the differential signal core lines 61 is integrally covered by an insulator 62. Although the cross-section of the insulator 62 approximately has an elliptical shape in the example illustrated in FIG. 8, but is not limited thereto. The insulator 62 may be formed of, for example, a fluorine resin having a low dielectric constant. Moreover, a conductive shield layer 63 is placed around the insulator 62 to cover the insulator 62 in order to suppress the influence of outside noise. The conductive shield layer 63 may be, for example, a metal tape that is wound around the insulator 62, or a seamless metal layer. Further, a sheath 64 serving as a protective covering for protecting the cable part 60 is arranged around the conductive shield layer 63 to cover the conductive shield layer 63. The sheath 64 may be formed of, for example, heat-resistant polyvinyl chloride (PVC).

Figure 9:
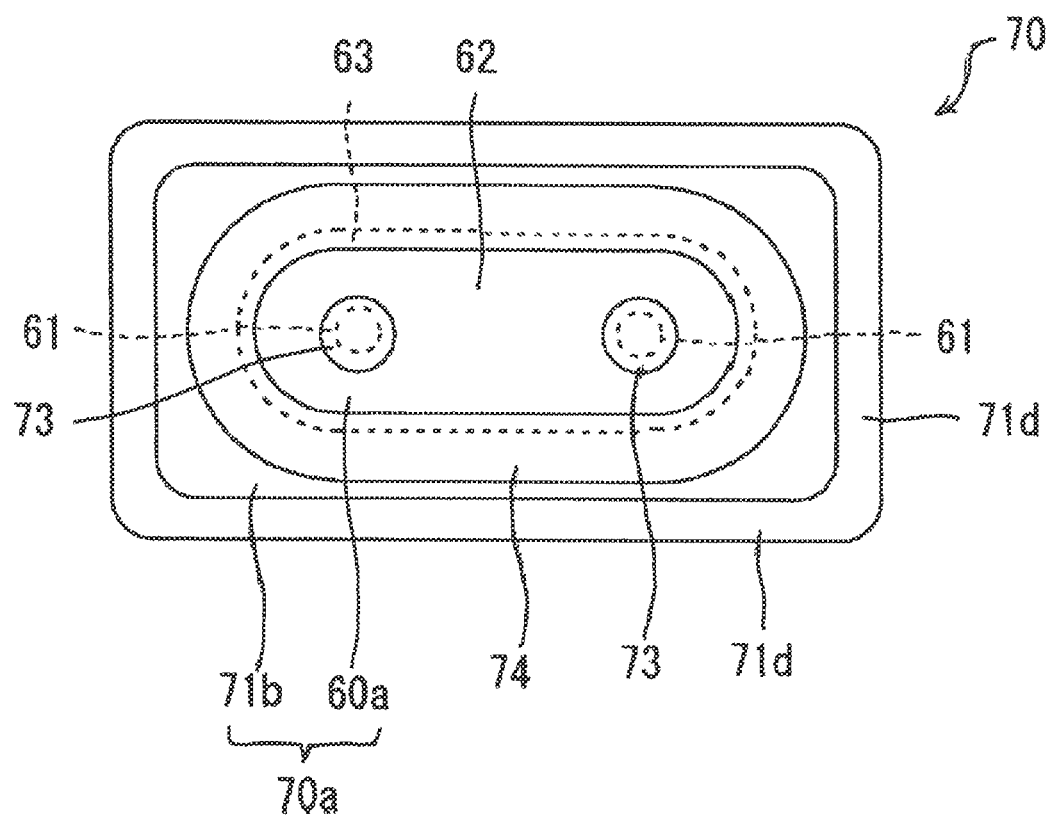
FIG. 9 is a view illustrating a front end surface of the contactor according to exemplary embodiment 1.

As illustrated in FIG. 7, the connector 70 is attached to the front end side of the contactor 50. FIG. 9 is a view illustrating the front end surface 70a of the connector 70 in the contactor 50 according to exemplary embodiment 1. The connector 70 is attached to the front end side of the contactor 50, and has a connector housing 71 that is insertable into the through hole 11 that penetrates the wiring board 1 in a thickness direction thereof, and a connector side contact 72 formed on the front end surface 70a of the connector 70. The connector housing 71 is formed of, for example, resin.

The sheath 64 is peeled off from the front end of the cable part 60 to which the connector housing 71 is attached, and thus the connector housing 71 is directly attached to an outer circumference of the conductive shield layer 63 that is exposed by peeling. The connector housing 71 refers to a housing that has an inner wall surface 71a corresponding to the shape of the outer surface of the conductive shield layer 63. In FIG. 7, reference numeral 71b denotes the front end surface of the connector housing 71, and reference numeral 71c denotes the rear end surface of the connector housing 71. The front end surface 71b and the rear end surface 71c of the connector housing 71 have a substantially rectangular shape, the rear end surface 71c being larger than the front end surface 71b. Further, reference numeral 60a denotes the front end surface of the cable part 60.

As illustrated in FIG. 7, the connector housing 71 is attached to the outer circumference of the cable part 60 such that the front end surface 60a of the cable part 60 and the front end surface 71b of the connector housing 71 are on the same plane. Consequently, the front end surface 70a of the connector 70 (hereinafter, referred to as a "connector front end surface") is formed by the front end surface 71b of the connector housing 71 and the front end surface 60a of the cable part 60 (see, e.g., FIGS. 7 and 9). Further, as illustrated in FIG. 7, the conductive shield layer 63 of the cable part 60 extends along the inner wall surface 71a of the connector housing 71 to the connector front end surface 70a.

Next, the connector front end surface 70a will be described. A connector side contact 72 is formed on the connector front end surface 70a to come into contact with the contact pin 41 of the LGA socket 4. The connector side contact 72 includes a pair of signal lands 73 and GND lands 74, which are formed on the connector front end surface 70a. The signal lands 73 are plane electrodes that are electrically connected with the front ends of the differential signal core lines 61 of the cable part 60 that is stretched to the connector front end surface 70a. One of the pair of signal lands 73 is connected to one of the pair of the differential signal core lines 61. Further, the other of the pair of signal lands 73 is connected to the other of the pair of differential signal core lines 61 for the differential signal. Each signal land 73 has a circular plane along the connector front end surface 70a, and is placed independently from the other signal land 73.

Further, each GND land 74 is a plane electrode that is electrically connected with the conductive shield layer 63 of the cable part 60 that is stretched to the connector front end surface 70a. The GND land 74 is connected with the conductive shield layer 63 at a boundary between the front end surface 60a of the cable part 60 and the front end surface 71b of the connector housing 71, and extends along the front end surface 71b of the connector housing 71. In the example illustrated in FIG. 9, the GND land 74 has a shape equivalent to a portion remaining by cutting a smaller elliptical portion out from an elliptical portion. Further, the GND land 74 is formed on the connector front end surface 70a independently from each of the pair of signal lands 73.

Moreover, as illustrated in FIG. 7, the connector housing 71 has a guide wall 71d that is a tapered side wall configured to connect the front end surface 71b with the rear end surface 71c. The guide wall 71d is formed as a surface inclined such that a sectional area of the connector housing 71 is gradually increased from the front end surface 71b towards the rear end surface 71c. The connector 70 having the above-described structure may be inserted into or fitted to the through hole 11 of the wiring board 1 illustrated in FIG. 6.

Figure 10:
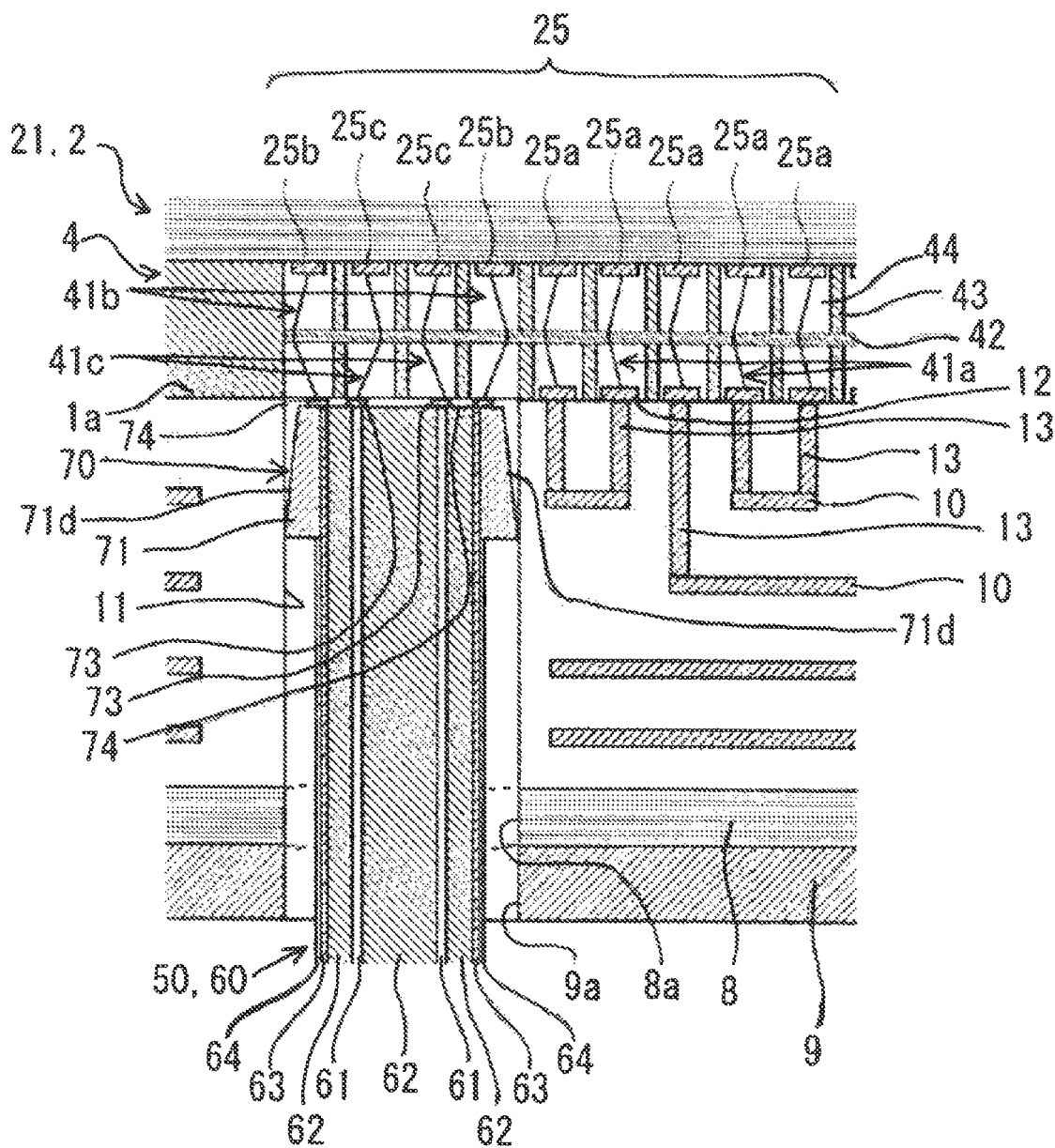
FIG. 10 is a view illustrating a state where the contactor is inserted into a through hole of the wiring board according to exemplary embodiment 1 to be connected to the LGA socket.
Figure 11:
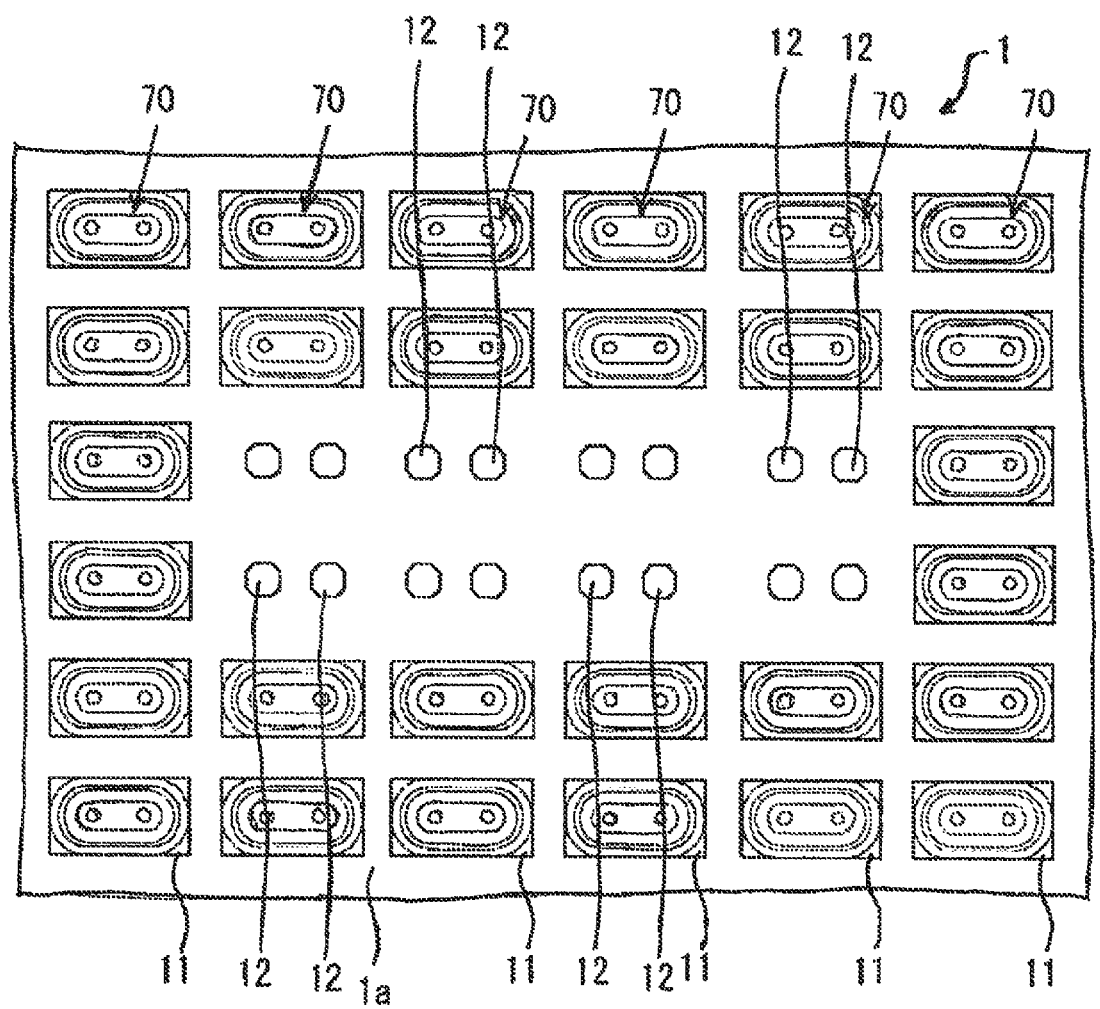
FIG. 11 is a view illustrating a portion of a mounting surface of the wiring board in a state where the contactor is connected to the LGA socket of the wiring board according to exemplary embodiment 1.

FIG. 10 is a view illustrating a state where a contactor 50 is inserted into a through hole 11 of the wiring board 1 according to exemplary embodiment 1 to be connected (mounted) to an LGA socket 4. FIG. 11 is a view illustrating a portion of the mounting surface 1a of the wiring board 1 in a state where connectors 70 are connected to LGA sockets 4 of the wiring board 1 according to exemplary embodiment 1.

Each through hole 11 of the wiring board 1 has a rectangular cross-section, and a connector housing 71 may be inserted into the through hole 11. In this exemplary embodiment, a cross-section of the guide wall 71d of the connector housing 71 is smaller than that of the through hole 11 at the location of the front end surface 71b. In detail, at the front end side of the connector housing 71, respective dimensions of long and short sides of the guide wall 71d are smaller than respective dimensions of long and short sides of the through hole 11. The connector 70 is inserted from the non-mounting surface 1b on the wiring board 1 into the through hole 11. Here, since the cross-section of the connector 70 (connector housing 71) at the front end side is smaller than the through hole 11, the connector 70 may be easily inserted into the through hole 11.

Further, the guide wall 71d of the connector housing 71 is slightly larger in cross-section than the through hole 11 at the location of the rear end surface 71c. In detail, at the rear end side of the connector housing 71, at least one of the long and short sides of the guide wall 71d is slightly larger in dimension than the respective long and short sides of the through hole 11. Thus, in the process of inserting the connector 70 (connector housing 71) into the through hole 11, the rear end side of the guide wall 71d is in slide contact with the inner wall surface of the through hole 11.

As such, while the guide wall 71d is in slide contact with the inner wall surface of the through hole 11, the connector 70 is inserted into the through hole. The guide wall 71d guides a pair of signal lands 73 on the connector 70 to the signal contact pins 41c of the LGA socket 4, respectively. Further, the guide wall 71d guides the GND land 74 on the connector 70 to the GND contact pin 41b of the LGA socket 4. That is, the pair of signal lands 7 on the connector 70 may be aligned with the signal contact pins 41c of the LGA socket 4, respectively, and the GND land 74 may be aligned with the GND contact pin 41b.

Further, the connector 70 is inserted to a defined position in the through hole 11, and the signal land 73 on the connector 70 is pushed against the signal contact pin 41c of the LGA socket 4 to be pressure-welded thereto. Further, the GND land 74 on the connector 70 is pushed against the GND contact pin 41b of the LGA socket 4 to be pressure-welded thereto. Thus, as illustrated in FIG. 10, the signal land 73 on the connector 70 may be electrically connected with the package side signal land 25c through the signal contact pin 41c of the LGA socket 4. Further, the GND land 74 on the connector 70 may be electrically connected with the package side GND land 25b through the GND contact pin 41b of the LGA socket 4.

Further, since the cross-section of the rear end side on the connector 70 is slightly larger than the through hole 11, the guide wall 71d engages with the inner wall surface of the through hole 11 in the state where the connector 70 is inserted into a defined position. Therefore, the connector 70 may be fitted to the through hole 11 against a weight of the contactor 50, thus allowing a contact of the connector side contact 72 with the contact pin 41 of the LGA socket 4 to be maintained. As illustrated in FIG. 10, the cable holding plate 9 is fixed to a back surface of the bolster plate 8 by a fixture 90 (see FIG. 2). Further, insert holes 8a and 9a are formed, respectively, on the bolster plate 8 and the cable holding plate 9 to correspond to the through hole 11 of the wiring board 1. The contactor 50 is inserted into the insert hole 9b (9a) of the cable holding plate 9 and the insert hole 8a of the bolster plate 8. The cable holding plate 9 may hold the contactor 50 by a frictional force between the sheath 64 on the cable part 60 of the contactor 50 and an edge of the insert hole 9a, thus suppressing the removal of the contactor 50.

In the connector 70 according to the present exemplary embodiment, the differential signal core lines 61 on the contactor 50 may be transmitted to the semiconductor chip 22 of the semiconductor package 2 without passing through the wiring pattern 10 of the wiring board 1. That is, since it is possible to transmit the high-speed electrical signal to the wiring board 1 without passing through the wiring pattern 10 of the wiring board 1, it is possible to reduce a transmission loss.

<Modification>

Figure 12:
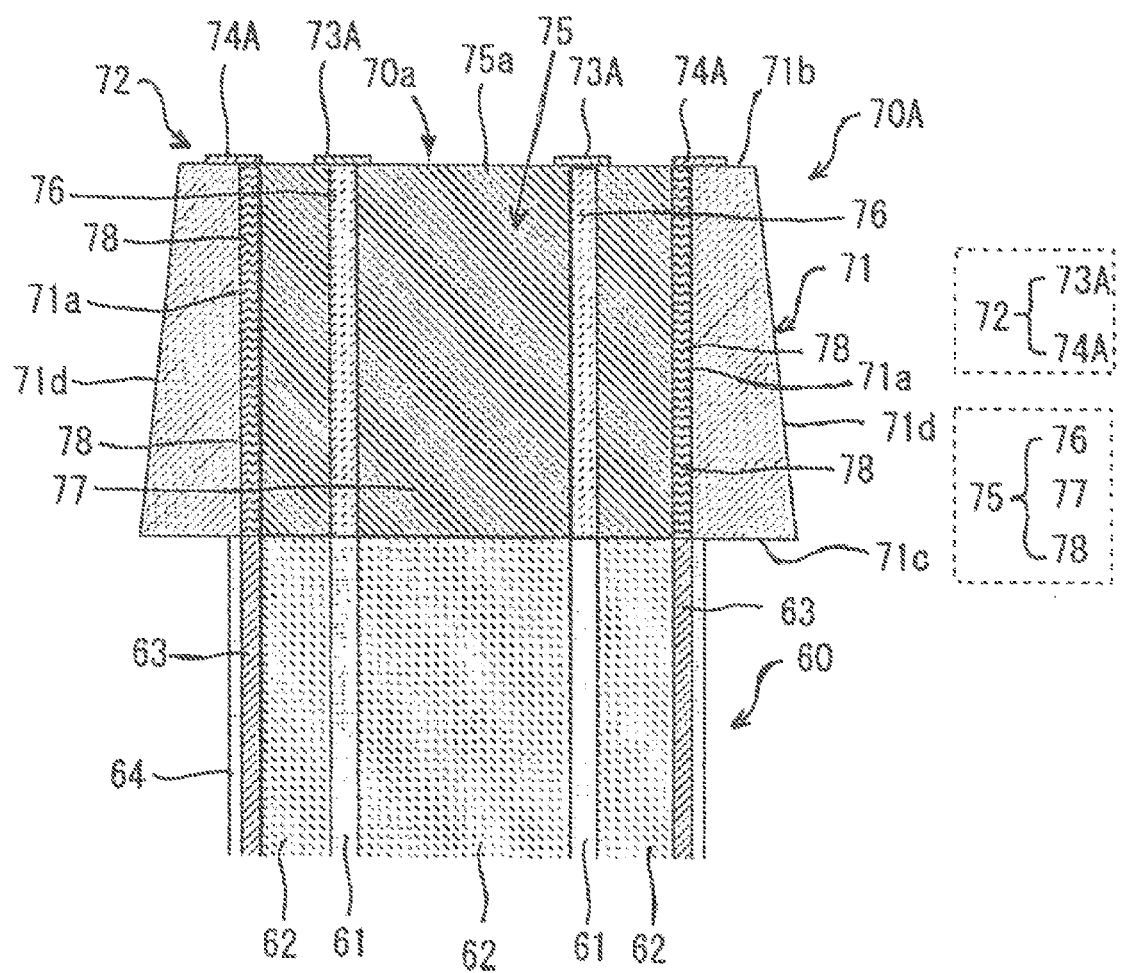
FIG. 12 is a view illustrating a contactor according to a variant.

Next, a connector 70a (70A) according to the variant will be described. FIG. 12 is a view illustrating the connector 70a according to the variant. The connector 70a stores a connector part 75 in the connector housing 71, and is mounted to the front end side of the cable part 60.

The connector part 75 has an extension core line 76 that is connected to the front end of the differential signal core line 61 for the differential signal on the cable part 60. Moreover, the connector part 75 includes an extension insulator 77 that covers the perimeter of the extension core line 76 and is connected to the front end of the insulator 62, and an extension conductive shield layer 78 that covers the perimeter of the extension insulator 77 and is connected to the front end of the conductive shield layer 63. In this variant, joints of the extension core line 76 of the connector part 75 with the differential signal core lines 61 of the cable part 60 are formed such that one of the joints is a male-type pin insert and the other is a female-type socket insert. The joints may be removably attached to each other. In this case, the connector 70a including the connector part 75 may be removably mounted to the cable part 60 of the contactor 50. Further, at the joints of the extension core line 76 of the connector part 75 with the differential signal core lines 61 of the cable part 60, the extension core line 76 and the differential signal core lines 61 may be joined by solder.

Further, the connector part 75 of the connector 70a is formed such that front ends of the extension core line 76, the extension insulator 77 and the extension conductive shield layer 78 extend to the connector front end surface 70a that is the front end surface of the connector 70a. As illustrated in FIG. 12, the connector housing 71 at the connector 70a is attached to the outer circumference of the connector part 75 such that the front end surface 75a of the connector part 75 and the front end surface 71b of the connector housing 71 are in the same plane. Consequently, the connector front end surface 70a of the connector 70a is formed by the front end surface 71b of the connector housing 71 and the front end surface 75a of the connector part 75.

The connector side contact 72 is formed on the connector front end surface 70a to come into contact with the contact pin 41 of the LGA socket 4, and the connector side contact 72 includes a pair of signal lands 73A and a pair of GND lands 74A. The pair of signal lands 73A is connected to the front end of each extension core line 76, and simultaneously is independently formed on the front end surface 75a of the connector part 75. Further, the GND lands 74A are connected to the front end of the extension conductive shield layer 78, and are formed on the front end surface 71b of the connector housing 71 independently from the pair of signal lands 73A, respectively.

The connector 70a stores, in the connector housing 71, the connector part 75 including the extension core line 76, the extension insulator 77, and the extension conductive shield layer 78 extending the differential signal core lines 61, the insulator 62, and the conductive shield layer 63 in the cable part 60. Even the connector 70a according to the present variant may achieve the high-speed cable transmission between the contactor 50 and the semiconductor package 2, similarly to the connector 70 illustrated in FIGS. 7, 9 and 10. The connector 70a may electrically connect the differential signal core lines 61 and the conductive shield layer 63 on the contactor 50 with the package signal land 25c and the package side GND land 25b without passing through the wiring pattern 10 of the wiring board 1. Thus, in the high-speed cable transmission between the contactor 50 and the semiconductor package 2, it is possible to reduce a transmission loss of the signal.

Exemplary Embodiment 2

Figure 13:
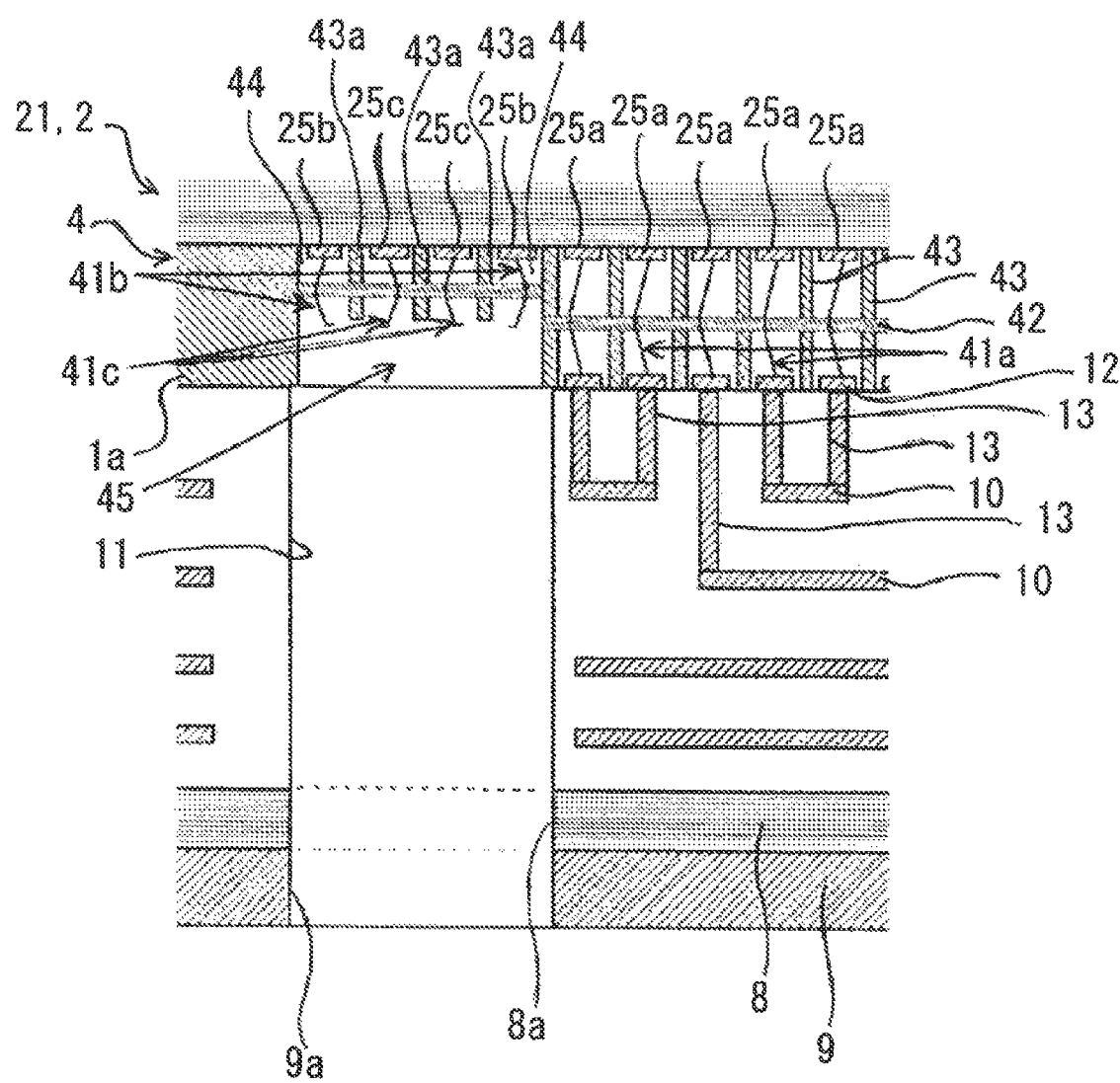
FIG. 13 is a partially enlarged view illustrating a sectional structure of a wiring board according to exemplary embodiment 2.
Figure 14:
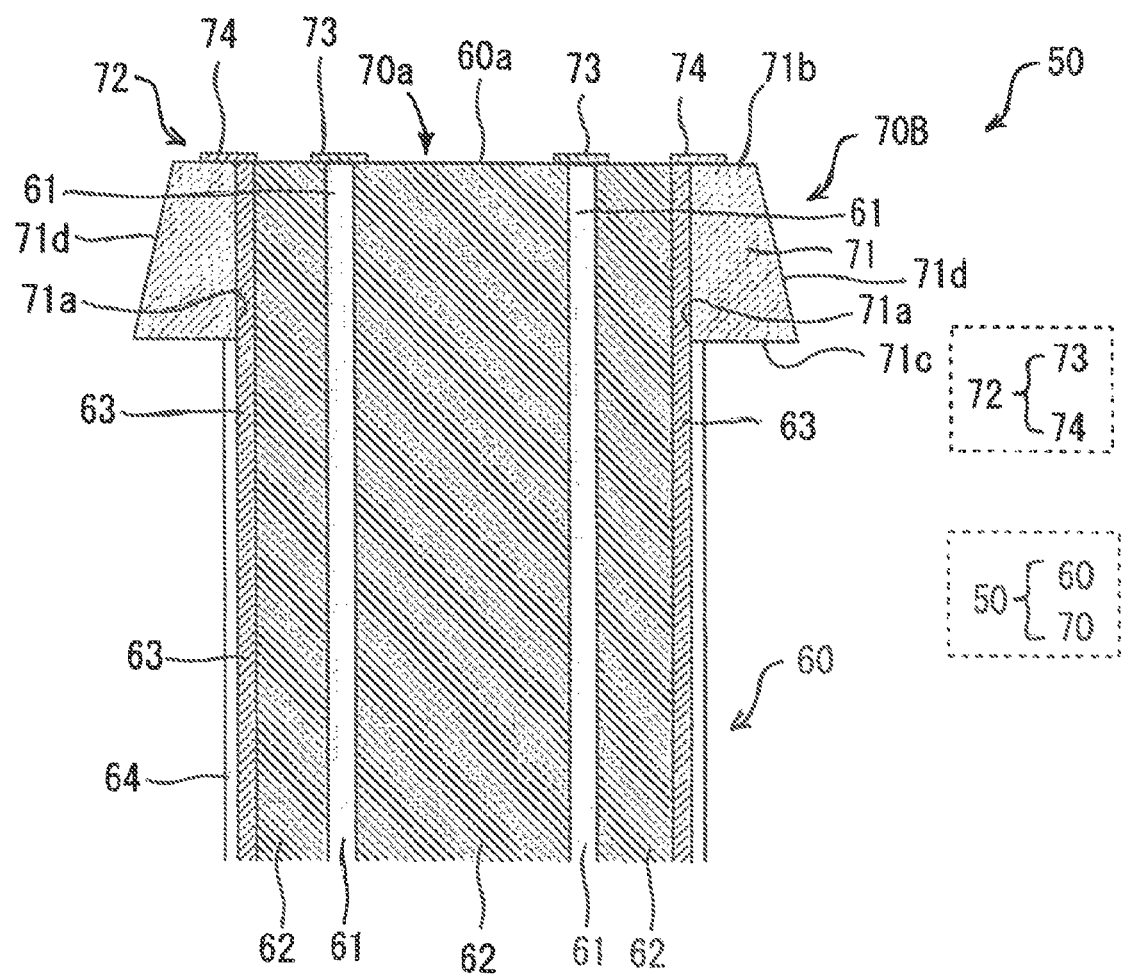
FIG. 14 is a view illustrating a longitudinal sectional structure of a contactor according to exemplary embodiment 2.

Next, exemplary embodiment 2 will be described. FIG. 13 is a partially enlarged view illustrating a sectional structure of a wiring board 1 according to exemplary embodiment 2. FIG. 14 is a view illustrating a longitudinal sectional structure of a connector 70B according to exemplary embodiment 2. The connector 70B according to exemplary embodiment 2 is attached to a front end of a cable part 60 on a contactor 50. A general structure of the connector 70B of exemplary embodiment 2 remains the same as the connector 70 of FIG. 7 except that an axial length of the connector is shorter than the connector 70 of exemplary embodiment 1. Hereinafter, a difference from the wiring board 1 according to exemplary embodiment 1 will be mainly described.

In this exemplary embodiment, a recess 45 is formed in a lower surface of an LGA socket 4 to allow a front end side of the connector 70 (70B) to be inserted and fitted therein. The lower surface of the LGA socket 4 is a surface that faces a mounting surface 1a of the wiring board 1. The recess 45 is formed at a position of the LGA socket 4 corresponding to a signal contact pin 41c and a GND contact pin 41b, that is, at a position where a connector side contact 72 of the connector 70 is mounted, and has a rectangular cross-section. As illustrated in FIG. 13, the LGA socket 4 of the present exemplary embodiment is configured such that a partition wall 43a partitioning a storage chamber 44 that stores the signal contact pin 41c from a storage chamber 44 that stores the GND contact pin 41b is shorter than other partition walls 43. Thereby, the recess 45 for accommodating a connector housing 71 is formed in the lower surface of the LGA socket 4.

Meanwhile, a guide wall 71d of the connector housing 71 in the connector 70B has a smaller cross-section than the recess 45 at a position of a front end surface 71b. In detail, at the front end side of the connector housing 71, respective dimensions of long and short sides of the guide wall 71d are smaller than respective dimensions of long and short sides of the recess 45. Further, at a position of a rear end surface 71c, the guide wall 71d of the connector housing 71 is slightly larger in cross-section than the recess 45. In detail, at a rear end side of the connector housing 71, at least one of the long and short sides of the guide wall 71d is slightly larger than the respective dimensions of the long and short sides of the recess 45. Moreover, even at the position of the rear end surface 71c, the guide wall 71d of the connector housing 71 is much smaller in cross-section than the through hole 11 of the wiring board 1.

Figure 15A:
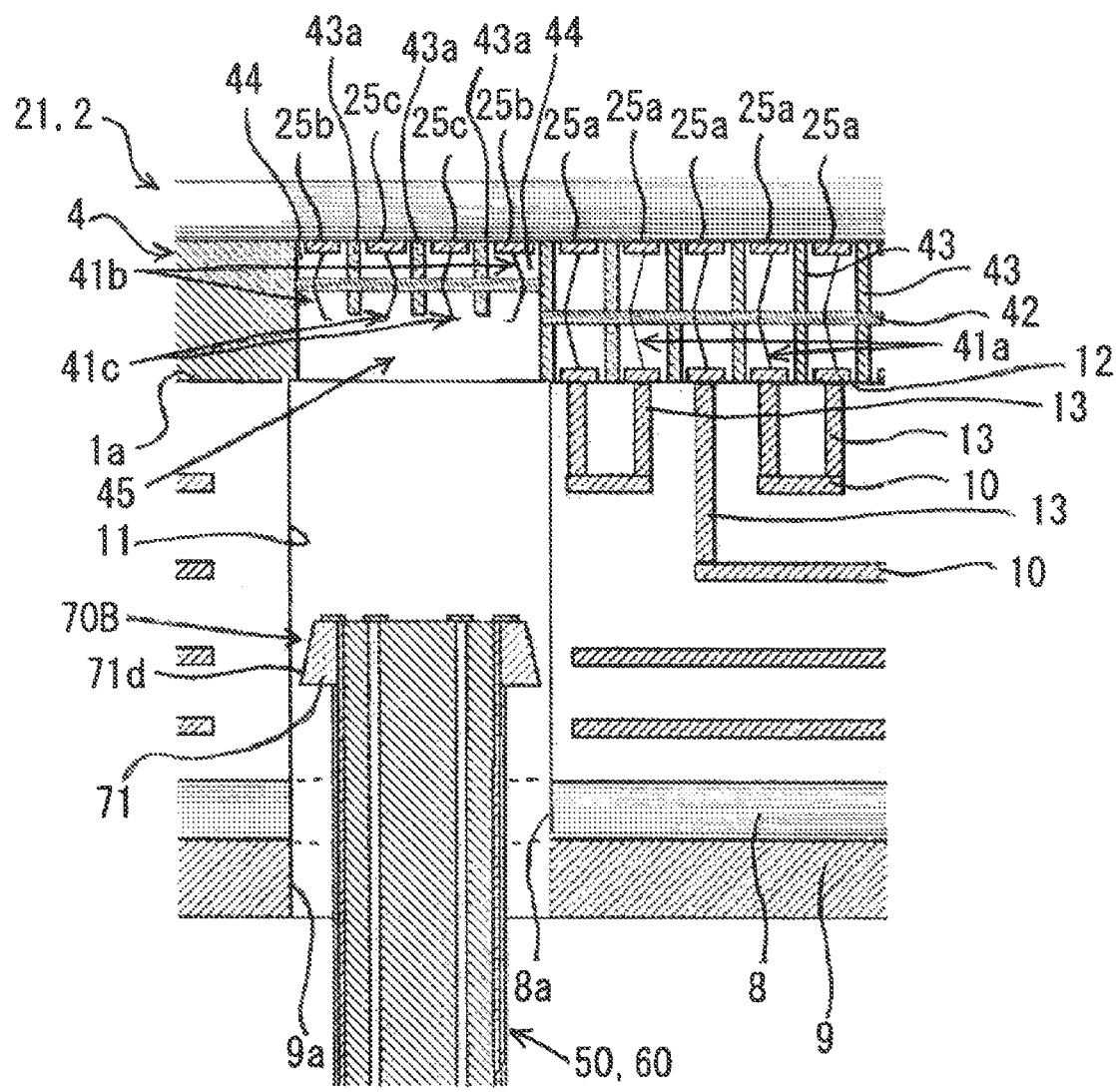
FIG. 15A is a view illustrating a state where the contactor is being inserted into a through hole of the wiring board according to exemplary embodiment 2.
Figure 15B:
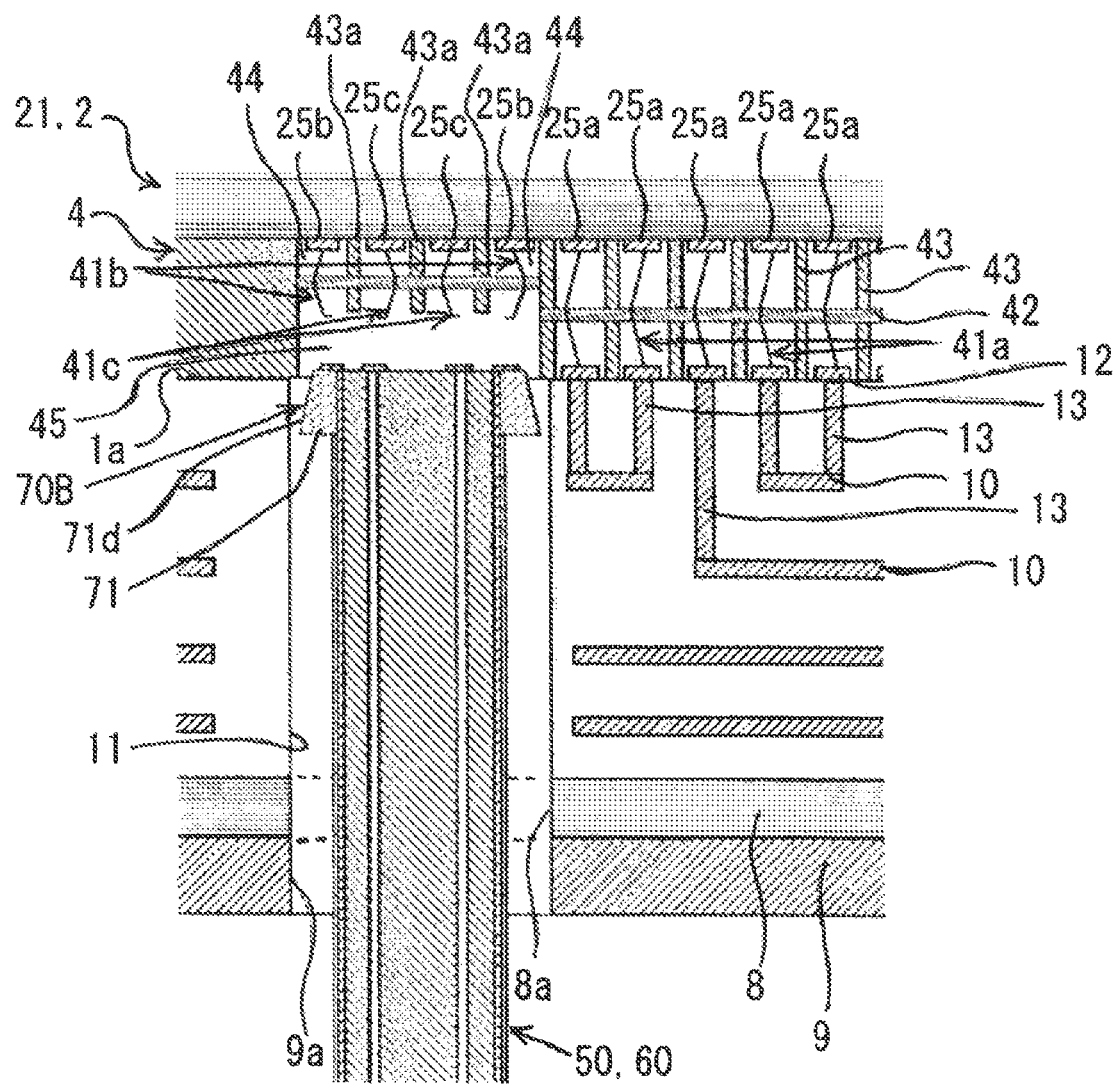
FIG. 15B is a view illustrating a state where the contactor is being inserted into a recess of an LGA socket according to exemplary embodiment 2.
Figure 15C:
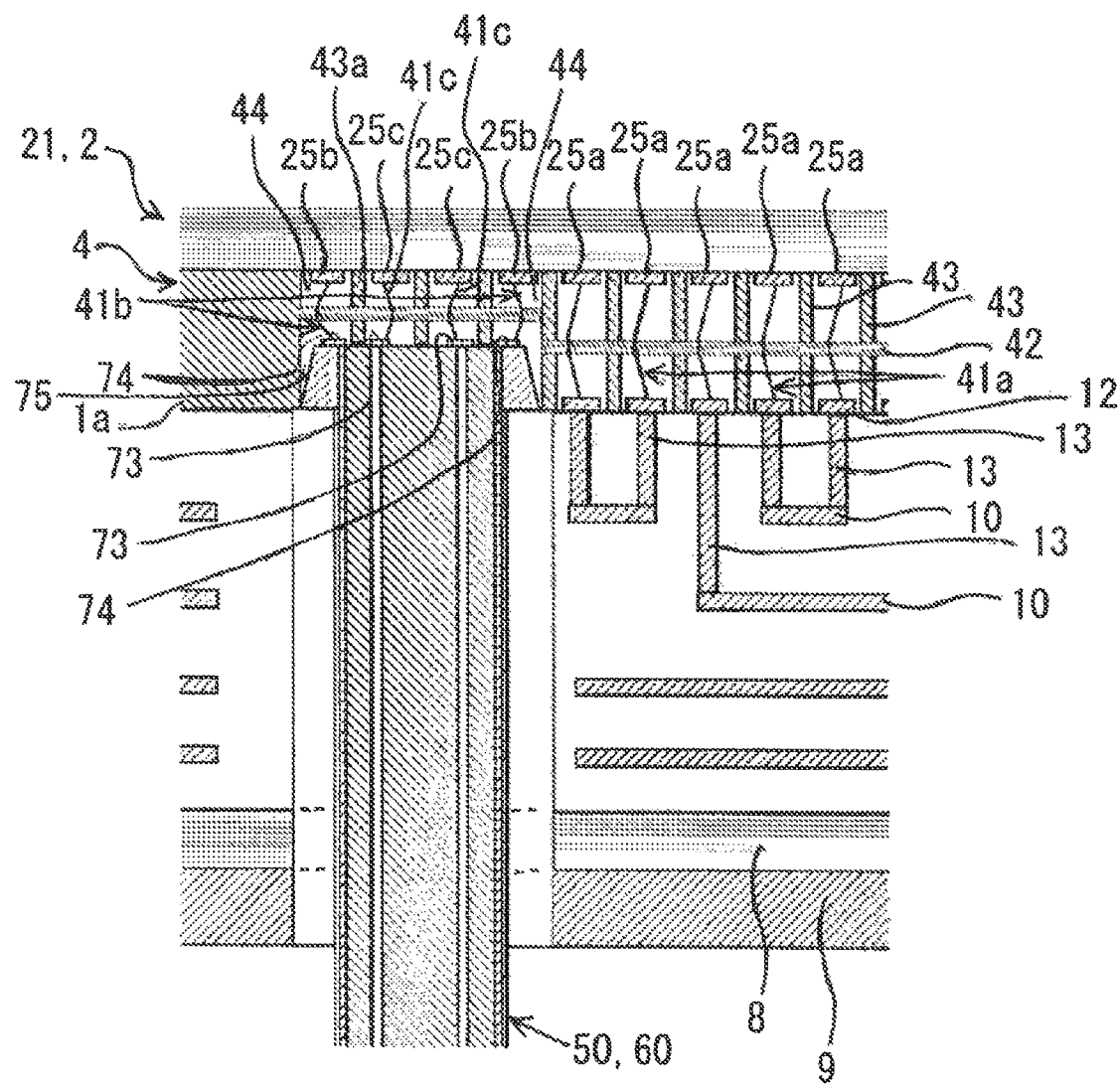
FIG. 15C is a view illustrating a state after a connector of the contactor according to exemplary embodiment 2 is connected to a contact pin of the LGA socket.

FIG. 15A is a view illustrating a state where the connector 70B is being inserted into a through hole 11 of the wiring board 1 according to exemplary embodiment 2. FIG. 15B is a view illustrating a state where the connector 70B is being inserted into the recess 45 of the LGA socket 4 according to exemplary embodiment 2. FIG. 15C is a view illustrating a state after the connector side contact 72 of the connector 70B according to exemplary embodiment 2 is connected to a contact pin 41 of the LGA socket 4.

As illustrated in FIG. 15A, the connector 70B is inserted from a non-mounting surface 1b of the wiring board 1 into the through hole 11. When the connector 70B is inserted into the through hole 11 of the wiring board 1, a clearance (gap) is created between the through hole 11 of the wiring board 1 and the connector housing 71. Therefore, the connector 70B may be smoothly guided into the LGA socket 4 without interference between an inner wall surface of the through hole 11 and the connector 70B. As illustrated in FIG. 15B, the connector 70B is inserted from the connector side contact 72 into the recess 45 of the LGA socket 4. Since the front end side of the connector housing 71 is smaller in cross-section than the recess 45, it is easy to insert the connector housing 71 into the recess 45.

As the connector housing 71 is progressively inserted into the recess 45, the guide wall 71d is in slide contact with the inner wall surface of the recess 45. Thus, a pair of signal lands 73 on the connector 70B is automatically aligned with signal contact pins 41c of the LGA socket 4, respectively, so that the GND land 74 may be aligned with the GND contact pin 41b.

If the connector 70B is inserted to a defined position in the recess 45 of the LGA socket 4, as illustrated in FIG. 15C, the pair of signal lands 73 is pushed against the signal contact pin 41c to be pressure-welded thereto. Further, the GND land 74 is pushed against the GND contact pin 41b to be pressure-welded thereto. Consequently, the signal land 73 on the connector 70B may be electrically connected with the package side signal land 25c, through the signal contact pin 41c of the LGA socket 4. Further, the GND land 74 on the connector 70B may be electrically connected with the package side GND land 25b, through the GND contact pin 41b of the LGA socket 4.

Here, the cross-section of the rear end side on the connector 70B is slightly larger than the recess 45 of the LGA socket 4. Thus, the guide wall 71d engages with the inner wall surface of the recess 45 of the LGA socket 4 in the state where the connector 70B is inserted to a defined position. Therefore, the connector 70B may be fitted into the recess 45 of the LGA socket 4 against a weight of the contactor 50, thus allowing a contact of the connector side contact 72 with the contact pin 41 of the LGA socket 4 to be maintained. Since the through hole 11 of the wiring board 1 may be formed to have a larger dimension than the cross-section of the connector 70B, high machining accuracy is not required when the through hole 11 is bored into the wiring board 1.

Although the connectors and the wiring boards having the same according to exemplary embodiments have been described, changes, improvement, combination or the like may be made in various ways on the exemplary embodiments. For example, in the above-described exemplary embodiments, a case wherein the connector 70 is applied to the differential transmission cable has been described by way of example, but the connector may be applied to other electric cables. In the present exemplary embodiments, the signal land 73 of the connector 70 is electrically connected to the package side signal land 25c of the semiconductor package 2 through the LGA socket 4, but the invention is not limited thereto.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A contactor coupled to an electrode of a semiconductor package mounted on a mounting surface of a wiring board, the contactor comprising:
   a cable including a core line;
   a connector attached to a front end of the cable, and to be inserted into a through hole that penetrates the wiring board in a thickness direction thereof; and
   a signal land formed on a front end surface of the connector, and electrically coupled with the core line,
   wherein the signal land is electrically coupled with a signal electrode formed over the semiconductor package through a signal contact of an LGA socket disposed between the mounting surface and the semiconductor package, and
   wherein the cable includes two differential signal transmission core lines covered by an insulator, and the signal land electrically coupled with each of the differential signal transmission core lines is independently formed on the front end surface of the connector.

2. The contactor according to claim 1, wherein the connector includes a guide wall to be in slide contact with an inner wall surface of the through hole and guide the signal land to the signal contact.

3. The contactor according to claim 1, wherein the connector includes a guide wall to be inserted into a recess formed in the LGA socket and be in slide contact with an inner wall surface of the recess so as to guide the signal land at a connector side contact to the signal contact.

4. The contactor according to claim 1, further comprising:
   a connector part stored in a connector housing, coupled to a front end of the core line in the cable, and having an extension core line that extends to the front end surface, wherein the signal land is formed on a front end of the extension core line, in the front end surface.

5. A wiring board comprising:
   a semiconductor package mounted on a mounting surface; and
   a contactor coupled to an electrode of the semiconductor package,
   wherein the contactor includes:
   a cable including a core line;
   a connector attached to a front end of the cable, and to be inserted into a through hole that is formed through the wiring board in a thickness direction thereof; and
   a signal land formed on a front end surface of the connector, and electrically coupled with the core line,
   wherein the signal land is electrically coupled with a signal electrode formed over the semiconductor package through a signal contact of an LGA socket disposed between the mounting surface and the semiconductor package, and
   wherein the cable includes two differential signal transmission core lines covered by an insulator, and the signal land electrically coupled with each of the differential signal transmission core lines is independently formed on the front end surface of the connector.

6. A contactor coupled to an electrode of a semiconductor package mounted on a mounting surface of a wiring board, the contactor comprising:
   a cable including a core line;
   a connector attached to a front end of the cable, and to be inserted into a through hole that penetrates the wiring board in a thickness direction thereof; and
   a signal land formed on a front end surface of the connector, and electrically coupled with the core line,
   wherein the signal land is electrically coupled with a signal electrode formed over the semiconductor package through a signal contact of an LGA socket disposed between the mounting surface and the semiconductor package, and
   wherein the cable comprises:
   an insulator covering an outer circumference of the core line; and
   a conductive shield layer covering a perimeter of the insulator,
   wherein a GND land electrically coupled with the conductive shield layer is formed on the front end surface of the connector, independently from the signal land, and the GND land is electrically coupled with an GND electrode formed over the semiconductor package, through a GND contact formed over the LGA socket.

* * * * *